(12) United States Patent
Rees

(10) Patent No.: US 8,085,146 B2
(45) Date of Patent: Dec. 27, 2011

(54) PATIENT HOIST WITH MONITORING SYSTEM

(75) Inventor: John Christopher Rees, Mumbles (GB)

(73) Assignees: Joerns Healthcare Limited, Worcestershire (GB); John Christopher Rees, Swansea (GB)

( * ) Notice: Subject to any disclaimer, the term of this patent is extended or adjusted under 35 U.S.C. 154(b) by 640 days.

(21) Appl. No.: 11/918,057

(22) PCT Filed: Apr. 7, 2006

(86) PCT No.: PCT/GB2006/001323
§ 371 (c)(1),
(2), (4) Date: Nov. 25, 2008

(87) PCT Pub. No.: WO2006/109050
PCT Pub. Date: Oct. 19, 2006

(65) Prior Publication Data
US 2009/0102667 A1    Apr. 23, 2009

(30) Foreign Application Priority Data

Apr. 9, 2005  (GB) .................................. 0507229.3
Nov. 11, 2005  (GB) .................................. 0523081.8

(51) Int. Cl.
*G08B 21/00* (2006.01)
(52) U.S. Cl. ..................... 340/540; 340/573.1; 340/635; 5/600; 5/610; 5/616; 5/618
(58) Field of Classification Search .................. 340/500, 340/540, 573.1, 635; 5/11, 16, 81.1 R, 83.1, 5/87.1, 424–425, 600–602, 610, 430, 611, 5/613, 616–618; 318/625; 702/150
See application file for complete search history.

(56) References Cited

U.S. PATENT DOCUMENTS

| | | | |
|---|---|---|---|
| 4,993,777 A | 2/1991 | LaPointe | |
| 5,335,313 A | 8/1994 | Douglas | |
| 6,279,183 B1 | 8/2001 | Kummer et al. | |
| 2004/0015321 A1* | 1/2004 | Nagaoka et al. | 702/150 |
| 2005/0077859 A1* | 4/2005 | Nagaoka | 318/625 |

FOREIGN PATENT DOCUMENTS

| | | |
|---|---|---|
| EP | 0 198 946 | 10/1986 |
| EP | 1 623 666 | 2/2006 |
| GB | 2 337 451 | 11/1999 |
| GB | EP 1 524 759 A2 | 4/2005 |
| JP | 9-28734 | 2/1997 |
| JP | 9-94271 | 4/1997 |
| JP | 9-220262 | 8/1997 |

OTHER PUBLICATIONS

United Kingdom Search Report for Application No. GB0523081.8, dated Jan. 17, 2006 (1 page).
United Kingdom Search Report for Application No. GB0523081.8, dated Jun. 29, 2007 (2 pages).

* cited by examiner

*Primary Examiner* — George Bugg
*Assistant Examiner* — Sisay Yacob
(74) *Attorney, Agent, or Firm* — Nixon & Vanderhye PC

(57) ABSTRACT

There is described a monitoring system for monitoring an apparatus for raising and lowering a person, for example an item of adjustable furniture or a hoist. The monitoring system comprises a memory for recording information relating to the operational history of the monitored apparatus. Amongst other information the memory may record periods when power supplied to an actuator of the apparatus exceeds a pre-defined threshold, and the number of operations performed by the apparatus. When the number of operations reaches a pre-determined amount the system can inhibit operation of the device.

17 Claims, 3 Drawing Sheets

PATIENT HOIST WITH MONITORING SYSTEM

This application is the U.S. national phase of International Application No. PCT/GB2006/001323 filed 7 Apr. 2006 which designated the U.S. and claims priority to Great Britain Application Nos. 0507229.3, filed 9 Apr. 2005 and 0523081.8 filed 11 Nov. 2005, the entire contents of each of which are hereby incorporated by reference.

The present invention relates to a monitoring system and particularly but not exclusively, to a monitoring system for an apparatus for raising and lowering a person, for example, adjustable furniture such as rise and recline chairs and beds, hoists and stair lifts.

Motorised furniture and hospital equipment such as rise and recline chairs, articulated beds and bath seats and hoists, are all designed to lift a maximum allowable load or weight. In some cases these products are subject to abuse or they may become non-functional due to deliberate or accidental disconnection of the power input, the motor connections or switch connections. Consequently, there is a need for a system which provides an historic validation of the manner in which the product has been operated.

In accordance with a first aspect of the present invention there is provided a monitoring system for monitoring an apparatus for raising and lowering a person, the monitoring system comprising a memory for storing information regarding the apparatus and/or monitoring system.

Preferably, the monitoring system further comprises a clock and the monitoring system is arranged to store in the memory the date indicated by the clock when the number of monitored operations of the apparatus reads a pre-determined amount.

Advantageously, this enable a manufacturer of the apparatus to use the recorded date as the start date for the warranty period for the apparatus when dealing with warranty claims.

In a preferred embodiment, the monitoring system monitors the re-charging of a re-chargeable battery for powering the apparatus and stores in the memory information regarding the re-charging of the battery.

Preferably, the memory records information regarding the cumulative usage of the apparatus and the monitoring system inhibits the operation of the apparatus when the amount of cumulative usages reaches a pre-determined amount. Inhibiting the operation of the apparatus in this way can prevent a user using the apparatus beyond a point that a maintenance service is recommended.

In accordance with a second aspect of the patent invention there is provided a monitoring system for monitoring the status of at least one circuit of a device, said system providing indication means and recordal means for recording at least one period when power supplied to said at least one circuit exceeds a pre-defined threshold.

In a preferred embodiment the device is an item of adjustable furniture such as a rise and recline chair or bed, or alternatively a hoist.

Preferably, the one or more circuits incorporate an actuator, this actuator either being associated with an individual circuit or being part of more than one circuit.

It is preferred that the operational characteristics of the circuit, for example the status of the or each actuator is displayed on a display such as a display panel which can be mounted either within the monitoring system or on a remote handset.

It is envisaged that the display panel can provide information about one or more of the following parameters, for example, how many times the circuit has been overloaded, the time and duration that the circuit was overloaded, and the levels of overloading either as moments in time of overloading or as a pattern over a pre-defined time period. By monitoring the pattern of operation it is possible to establish the mode of operation of the device and gauge whether this is through misuse or through an operator not comprehending the correct way to use the device.

Preferably, the status of said circuit is provided on display panel having an alphanumeric display, for example a digital display. It is also envisaged that the display is illuminated, for example for operators that may be partially sighted.

Preferably, the display is provided on a handset in communication with the device either physically or which is in wireless communication with a receiver or transmitter on the device. However, it is envisaged that the display may be incorporated in the device itself, for example in a panel of the arm of a chair or on a panel on the side of a bed, which is accessible to an operator. It is envisaged that if the monitoring system, an actuator, or any peripheral device connected to the monitoring system are tampered with or disconnected, this action is also recorded by the system and/or an alarm can be activated to indicate that tampering is, or has occurred.

The display also offers information to the user or to a operator, such as a service technician, about parameters that have been monitored for the circuit, which also includes data about the power available to the motor or motors within the circuit to establish the work pattern of the motors within the or each circuit.

Preferably, the system identifies the power value available to said circuit for example, when the device is battery operated, the level of charge remaining for operation of the device is monitored. It is preferred that if the battery level is below a certain level, an alarm, which may be visual, audible or sensory or a combination of one or more of the aforesaid alerting means can be used to prompt the user to recharge the batteries for the device.

It is also envisaged that the monitoring system can monitor whether a person is actually in contact with the item of furniture and if no contact is detected, the system can switch to a power-saving mode. On sensing the presence of a person sitting or lying on the device, the monitoring system can then switch to full operational mode.

Preferably, the system records the cumulative usage of actuators and after a certain level of usage a service technician can be alerted to check or overhaul the actuators.

It is preferred that the data recorded on said system can be accessed and modified remotely via a telephone modem system. It is further envisaged that a remote alarm can be activated to alert a service technician or a carer, such as a nurse if the device is operating incorrectly.

Preferably, the recorded data can be recalled via a plug-in peripheral device such as a computer.

It is envisaged that the computer can interrogate the device over a period of time and download data about use of the device. Preferably, the device can also upload data so that new threshold parameters can be set for the device after monitoring a pattern of use. An example would be where a person has increased in weight and the device can be uploaded with data about the loading levels that are acceptable for a motor taking into account the person's weight gain. Further if the weight gain is substantial a technician can be alerted to service the motor on a more frequent basis.

In accordance with a third aspect of the invention there is provided a monitoring system for monitoring an apparatus for raising and lowering a person, wherein the monitoring system is arranged to monitor for a moveable part of the apparatus being moved into abutment against an object.

In accordance with a fourth aspect of the invention there is provided a monitoring system for monitoring an apparatus for raising and lowering a person whereon the monitoring system is arranged to present to an operator fault information relating to a fault detected in an apparatus monitored by the system.

A preferred embodiment of the present invention will now be described by way of example only and with reference to the accompanying drawings in which.

Figure 1A:
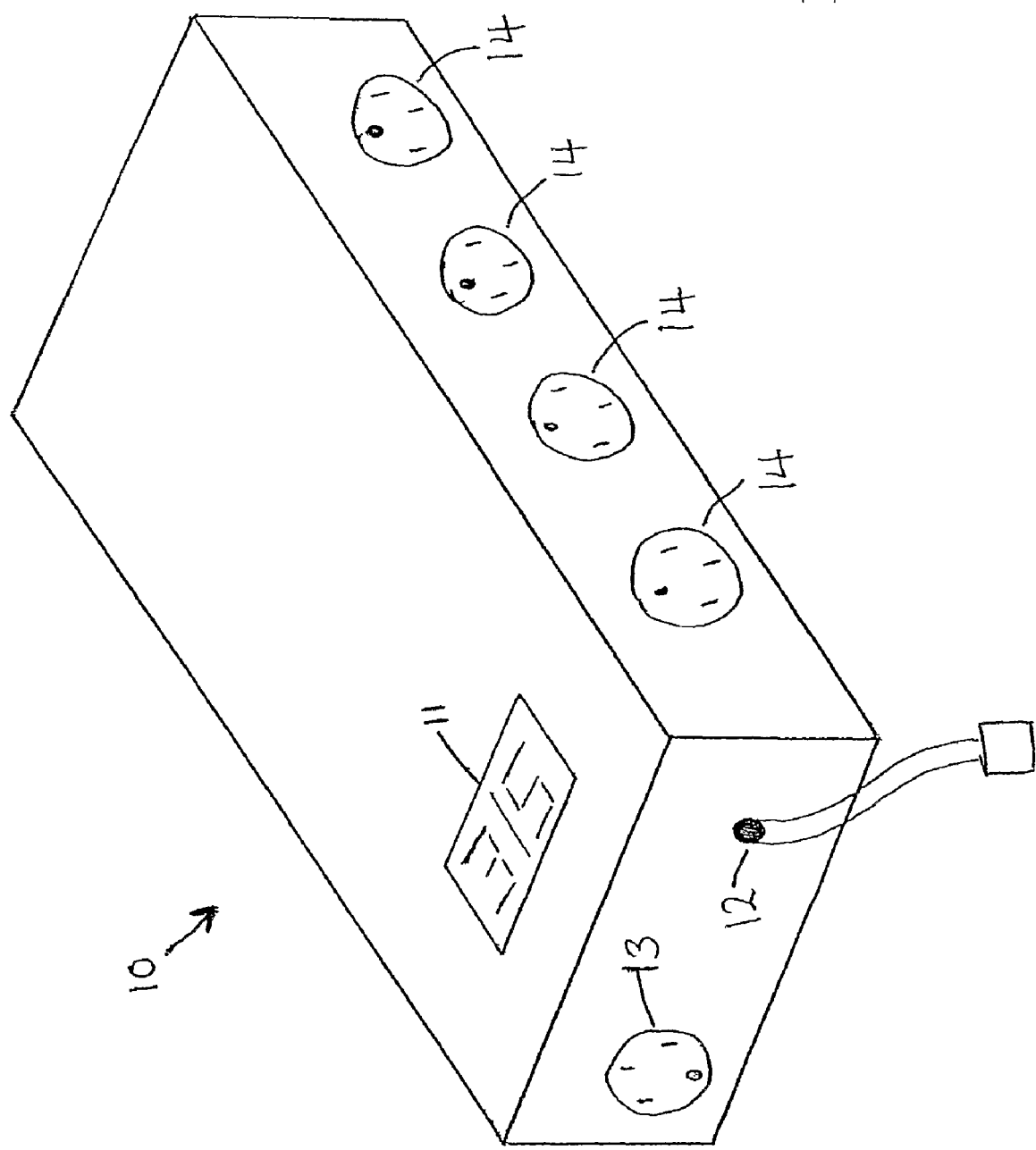
FIG. 1a is a schematic illustration of the monitoring system incorporating a display.
Figure 1B:
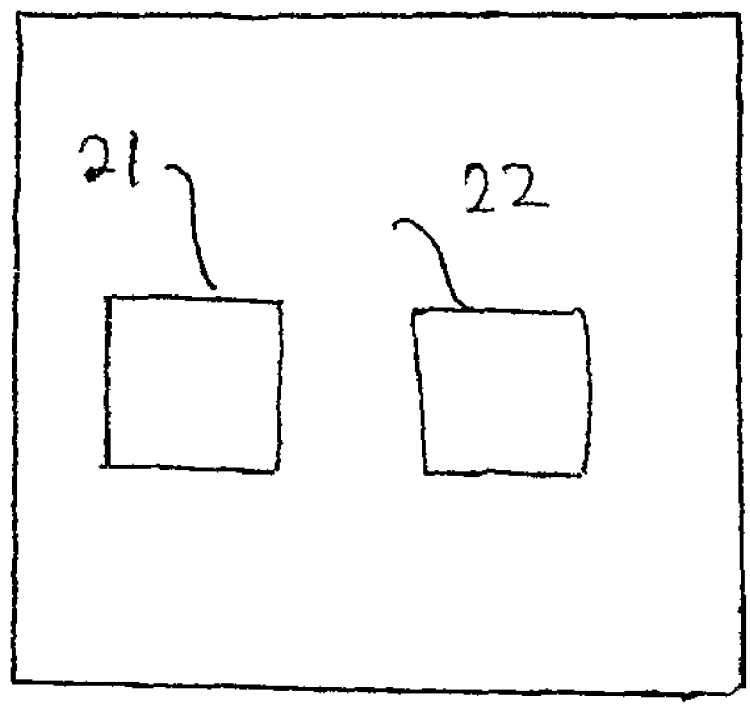
FIG. 1b is a schematic illustration of internal circuitry of the monitoring system.

Referring to FIGS. 1a and 1b, there is shown a monitoring system 10 comprising a display 11, a power input connection 12 for powering the system, a handset connection 13 and a plurality of circuit connections 14 to monitor the status of actuators for example motors (not shown) incorporated within the respective circuits. The monitoring system 10 is also provided with circuitry 20 comprising a processor 20 and a memory 21.

The display 11 provides fault information such as whether power has been disconnected, whether motors have been overloaded, and other operational information such as the time when a service is required. In a preferred embodiment a plurality of two digit codes are stored in the memory 21, each code being indicative of a possible apparatus fault, for example 01—current overload when hoist lifting,
02—battery pack fault,
03—power cable faulty/disconnected, etc.

If the monitoring system 10 detects a fault in the monitored apparatus for which an appropriate code is available the code is displayed on the display. An operator can then simply consult an operator's manual to ascertain the nature of the fault indicated by the code or telephone a service engineer and inform the engineer which code is being displayed on the display.

Figure 2:
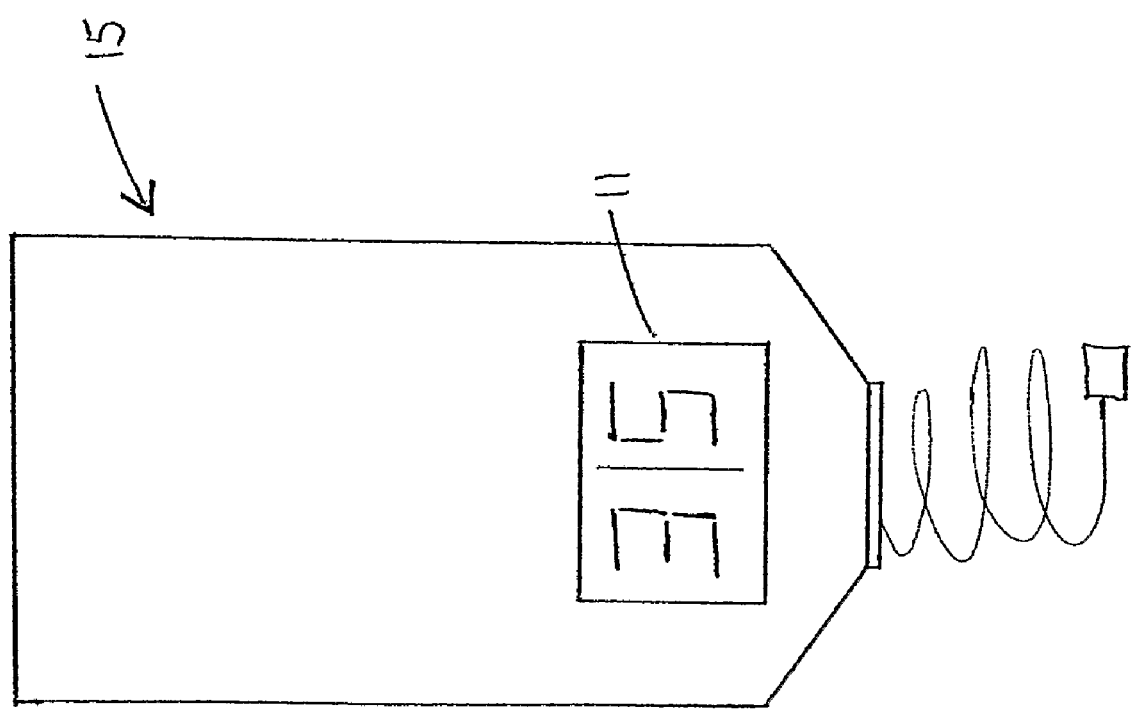
FIG. 2 is a schematic illustration of a handset incorporating a display.

In FIG. 2 the display 11 is shown mounted to a handset 15 which can be connected to the monitoring system 10 via the handset connection 13.

The monitoring system 10 is suited for chairs and beds which can be configured to assist a person in taking up a seated or recumbent position, or alternatively, for assisting a person in rising from a chair or bed. For example, a reconfigurable motorised chair operated by two motors can be preset to allow the chair to lift and lower a person weighing 120 kg, provide a chair recline to support 80 kg, as well as a leg support capable of lifting and lowering 70 kg.

The monitoring system 10 is also suited for hoists that enable the safe lifting and transferring of infirm, elderly, disabled or obese patients. Such hoists typically comprise a support base, a mast, a boom, a lifting mechanism, a swivel bar and a seat. The mast connects the base to the boom and supports the lifting mechanism. The boom is pivotally connected to the top of the mast, extends over the base and supports the swivel bar from which the seat is suspended. In use, a patient is seated in the seat and the lifting mechanism activated to pivot the boom relative to the mast to raise or lower the patient. The lifting mechanism may be driven by any suitable actuator for example, one or more motors.

Whatever type of apparatus the monitoring system is used in conjunction with, by monitoring the power supplied to the motor or motors, the display 11 can indicate whether the pre-defined settings have been exceeded. At the same time, the data can be recorded within the memory of system 10. For example, each time a motor or actuator over current event takes place, the monitoring system 10 can display a warning indicator and record details of the event in its memory.

The stored data can be recalled at any time, either via the display 11 or via a plug-in peripheral device such as a computer. In addition, the monitoring system 10 provides the option for remote accessing of the stored data via a telephone modem system.

Furthermore, the monitoring system 10 can be programmed to cease or reverse operation if a user is trying to move a weight that is above a recommended maximum load.

A monitoring system 10 of the present invention, as exemplified above, allows the operational history of a motorised system, for example chair, bed or hoist to be recorded and thus assessed, to improve its operational function. Additionally, when the motorised system fails to operate, the user will often contact the supplier to report the malfunction and request assistance to repair the malfunction. However, the user of the system may have deliberately or accidentally overloaded the manufacturers recommended maximum load or weight limit, causing damage and malfunction of the system. In such cases, the monitoring system provides a validation to any claim against the system, whilst the system is under warranty.

The monitoring system 10 can be programmed to determine and record the cumulative workload of a motor so that after a pre-determined workload has been reached a technician can be called to service the motor. This approach for determining when a service is due is better than doing so on the basis of the measured total run time of a motor. This is because more strain may be put on a motor that lifts a relatively heavy weight a relatively small number of times than on a motor that lifts a relatively light weight a relatively large number of times, despite the total run time for lifting the heavy weight being less than that for lifting the lighter weight. The display 11 can indicate to a user that a service is required. Alternatively, the monitoring system 10 may be provided with an LED that lights when a service is required.

The monitoring system 10 may also be provided with a real time clock (not shown) either as hardware or as software. The clock and associated software may be used to record the approximate date on which the apparatus used with the control system is put into service by an end user. To achieve this, the software may count the number of operations performed by the apparatus and records the date indicated by the clock when the counted number of operations reaches a pre-determined number, say ten. The pre-determined number is selected to be high enough so if reached it is likely that the apparatus is in commission rather than merely being tested or demonstrated. The recorded date may be used as a start date for the warranty period of the apparatus. Proof of the commissioning date of the apparatus would be useful in countering false claims made by dealers that faulty apparatus had malfunctioned during the warranty period rather than afterwards.

The time indicated by the clock each time a motor or actuator is overloaded may also be recorded. This information may be useful in countering bogus warranty claims. Thus, if a user has overloaded a motor multiple times in a short time period, for example, five times within ten minutes and so caused a motor malfunction, this information is recorded and may be used to counter any ensuing warranty claim.

The memory of monitoring system 10 may be used to securely register or store the serial numbers or other information relating to the monitoring system itself, the particular lifting apparatus monitored by the system 10, the actuators designated for use with the apparatus monitored by the system 10, or any peripheral devices connected to the system 10. It has been known for non-qualified people to replace a faulty hoist actuator with a working actuator of lower power, for example a 10000N actuator with a 6000N actuator. This can cause incorrect and dangerous operation of the hoist. Registering equipment information in the memory may allow suppliers to identify that changes have been made to original equipment and thus may assist in rejecting warranty claims that stem from a fault or accident caused by inappropriate replacement equipment.

As a safety feature, the monitoring system 10 may monitor the number of times a motor or actuator has been used in a given time period, either under load or no load, and calculate a cut out point for the motor or actuator beyond which it should be rested for a time period. When the cut out point is reached, the display 11 indicates to the user that the apparatus should be left idle for the time period.

The monitoring system 10 may also be arranged to monitor for a moving part of a lifting apparatus becoming trapped against another object, thus endangering an occupant of the lifting apparatus. For example, the monitoring system 10 may be arranged to monitor for the boom of a hoist becoming trapped against a wall or other such surface. This may be achieved by means of a pressure sensor fixed to the moving part and connected to the monitoring system 10, for example by way of a control wire. In operation, if the part becomes trapped against an object, pressure applied to the sensor by the object is detected by the monitoring system 10, which in response turns off or reverses the actuator that is driving the moving part. This reduces the likelihood of a trapped boom or the like springing free under power of an actuator and injuring an occupant. The monitoring apparatus 10 may have inputs for connection to a plurality of pressure sensors each arranged on a different part of the apparatus.

The monitoring system 10 may be used to monitor apparatus powered by a rechargeable battery. For example, a 24 volt D.C 3 amp/hour rechargeable battery is typically used to power a hospital hoist. Such a battery is connected to a battery charger to recharge, and the charger normally has indictor lights to show the charging state of the battery. For example, a red light for when the battery is still charging and a green light for when the battery is charged. If an operator continually disconnects a battery from a charger before the battery is fully charged, that is before the green light lights, the battery will soon degrade. The monitoring system 10 may be arranged to monitor a charging battery and store battery charging information in its memory. The information may include the total number of times a given battery has been charged, the total number of times a given battery has been incorrectly charged as well as when the incorrect charges took place. Each time a battery is charged the monitoring system 10 may record the time the charge started, the battery voltage at the start time, the time the charge ended and the battery voltage at this time.

The monitoring system 10 may be provided with a key pad (not shown) by means of which an operator must enter a pre-defined code in order to be able to operate the apparatus monitored by the system. Different codes may be used to distinguish between a patient and a health care worker responsible for the apparatus. The patient code may allow partial use of the apparatus, in other words those functions of the apparatus deemed safe enough for an un-supervised patient to use. In contrast, the health care worker's code allows full use of the apparatus.

The monitoring system 10 may be programmed to count the number of operation cycles (i.e one lift followed by one lowering) of the lifting apparatus and to indicate on the display when the number of completed operations is approaching the number that necessitates a servicing of the apparatus. For example, if a manufacturer sets a service interval of 5000 cycles, at 4750 cycles from the last service, the monitoring system 10 may inhibit the operation of the apparatus and the display may indicate to a user that a service is due in 250 cycles and that an appropriate engineer should be called. The display may then prompt the user to press a particular sequence of buttons to re-activate the apparatus. After 5000 cycles the monitoring system may again inhibit operation of the apparatus and the display may indicate to the user that a service is now required and that the apparatus will only operate a further number of times, say 10, unless the service is performed. The display may then prompt the user to press a particular sequence of buttons to re-activate the apparatus. At 5010 cycles, the monitoring system inhibits the operation of the apparatus until a service engineer services the apparatus and resets the monitoring system 10 to re-activate the apparatus.

Although individual aspects of the invention have been described, the invention is also intended to cover combinations of the embodiments or aspects described.

The invention claimed is:

1. A patient hoist comprising a lifting mechanism which raises and lowers a suspended patient, the lifting mechanism including at least one electrical actuator which moves the lifting mechanism, and a battery which energizes the said actuator;
   a controller which controls the lifting mechanism;
   a monitoring system which monitors a status and/or use of the actuator and/or one or more parts of the hoist, including monitoring power supplied to the said actuator and a duration of the supplied power;
   a clock which outputs a date and time of usage of the said actuator, including a cumulative period of use of the said actuator;
   an analyzer which compares data from the monitoring system with pre-stored data, and which outputs an alert and/or disables the hoist;
   a memory unit which records an input to the monitoring system, an output of the clock, and an output of the analyzer; and
   a retrieval module which retrieves data stored in the memory unit, the retrieval module including a display,
   wherein the memory unit records a cumulative workload of said actuator to determine cumulative strain over time, and a serial number of the actuator so as to avoid or limit a use of unsuitable parts.

2. A patient hoist as claimed in claim 1, wherein the monitoring system includes a sensor which detects obstruction of the lifting mechanism, the lifting mechanism being controllable by the controller to halt or reverse on receipt of a signal from the said sensor.

3. A patient hoist as claimed in claim 1, wherein the monitoring system includes a further sensor which detects an overloading of the lifting mechanism, the lifting mechanism being controllable by the controller to halt or reverse on receipt of a signal from the said further sensor.

4. A patient hoist as claimed in claim 1, wherein the lifting mechanism includes at least a further said actuator, the memory unit also recording a cumulative workload of said further actuator, an output of the clock relating to said further actuator, and a serial number of the said further actuator.

5. A patient hoist as claimed in claim 1, wherein the monitoring system monitors an over current event of the or each actuator, and the memory unit records the over current event.

6. A patient hoist as claimed in claim 5, further comprising a warning indicator which is energisable on the occurrence of the over current event.

7. A patient hoist as claimed in claim 1, further comprising a service indicator which indicates that a service is due and which is operable when the cumulative workload recorded by the memory unit reaches a predetermined value.

8. A patient hoist as claimed in claim 1, wherein the retrieval module comprises a handset on which the display is provided.

9. A patient hoist as claimed in claim 1 wherein the retrieval module includes a modem which remotely accesses the memory unit.

10. A patient hoist as claimed in claim 1, wherein the memory unit stores a number of uses of the lifting mechanism, and stores a specific output of the clock when the number of uses reaches a predetermined value for a first time, the specific output of the clock being the start of a warranty period.

11. A patient hoist as claimed in claim 1, wherein the memory unit stores a further number of uses of the lifting mechanism during a predetermined period, the said display indicating to a user that the lifting mechanism should not be used when said further number of uses in the predetermined period is reached.

12. A patient hoist as claimed in claim 1, wherein the said battery is rechargeable, and the monitoring system can monitor a charging of the battery, battery charging information being outputable from the monitoring system to the memory unit for recordal.

13. A patient hoist as claimed in claim 1, further comprising a keypad which receives a code to enable operation of the lifting mechanism.

14. A patient hoist as claimed in claim 13, wherein a first said code partially enables the hoist, and a second said code enables fully enables the hoist.

15. A patient hoist as claimed in claim 1, wherein the memory unit stores an additional number of uses of the lifting mechanism, the said display indicating to a user that the hoist should be serviced when said additional number of uses is reached.

16. A patient hoist as claimed in claim 15, wherein the lifting mechanism is resettably disabled once the additional number of uses is reached.

17. A patient hoist as claimed in claim 1, further comprising a support base, a mast, a boom, a swivel bar and a seat.

\* \* \* \* \*